(12) United States Patent
Kim et al.

(10) Patent No.: US 9,798,469 B2
(45) Date of Patent: Oct. 24, 2017

(54) STORAGE DEVICE AND CONTROLLING METHOD THEREOF

(71) Applicant: Samsung Electronics Co., Ltd., Suwon-si, Gyeonggi-do (KR)

(72) Inventors: YoungWook Kim, Hwaseong-si (KR); Kui-Yon Mun, Hwaseong-si (KR); Soong-Mann Shin, Suwon-si (KR); Jae-Sung Yu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 25 days.

(21) Appl. No.: 14/662,736

(22) Filed: Mar. 19, 2015

(65) Prior Publication Data

US 2016/0034189 A1    Feb. 4, 2016

Related U.S. Application Data

(60) Provisional application No. 62/031,293, filed on Jul. 31, 2014.

(30) Foreign Application Priority Data

Sep. 23, 2014   (KR) ..................... 10-2014-0126730

(51) Int. Cl.
*G06F 3/06* (2006.01)
*G11C 16/04* (2006.01)
*G11C 7/04* (2006.01)

(52) U.S. Cl.
CPC ............ *G06F 3/061* (2013.01); *G06F 3/0659* (2013.01); *G06F 3/0679* (2013.01); *G06F 3/0688* (2013.01); *G11C 7/04* (2013.01); *G11C 16/0466* (2013.01)

(58) Field of Classification Search
CPC ...... G06F 3/061; G06F 3/0659; G06F 3/0679; G06F 3/0653; G06F 3/06; G11C 16/0466; G11C 7/04; G11C 16/04
USPC .......................................................... 711/103
See application file for complete search history.

(56) References Cited

U.S. PATENT DOCUMENTS

| | | |
|---|---|---|
| 5,451,892 A | 9/1995 | Bailey |
| 6,735,546 B2 | 5/2004 | Scheuerlein |
| 6,954,394 B2 | 10/2005 | Knall et al. |
| 7,057,958 B2 | 6/2006 | So et al. |
| 7,755,965 B2 * | 7/2010 | Chen ........................ G11C 7/04 365/158 |
| 7,849,261 B2 | 12/2010 | Pherson et al. |
| 8,225,031 B2 | 7/2012 | Lee et al. |
| 8,429,436 B2 | 4/2013 | Fillingim et al. |
| 8,499,132 B1 * | 7/2013 | Pasupathy ............... G06F 3/061 711/103 |

(Continued)

*Primary Examiner* — Pierre-Michel Bataille
(74) *Attorney, Agent, or Firm* — Harness, Dickey & Pierce, P.L.C.

(57) ABSTRACT

A storage device includes a nonvolatile memory and a memory controller. The nonvolatile memory performs read, write, and erase operations. The memory controller operates in an operating mode where the memory controller exchanges a voltage signal, set to a reference voltage level within an allowable range, with the nonvolatile memory or receives the voltage signal from an external device. When operating in the operating mode, the memory controller optimizes an operating frequency of the nonvolatile memory depending on a voltage level of the voltage signal and a temperature.

12 Claims, 11 Drawing Sheets

(56) References Cited

U.S. PATENT DOCUMENTS

| | | |
|---|---|---|
| 8,582,374 B2 | 11/2013 | Mozak et al. |
| 8,694,719 B2 | 4/2014 | Lassa et al. |
| 8,707,072 B2 | 4/2014 | Wilcox |
| 2003/0046020 A1 | 3/2003 | Scheuerlein |
| 2004/0100831 A1 | 5/2004 | Knall et al. |
| 2005/0078537 A1 | 4/2005 | So et al. |
| 2008/0005469 A1 | 1/2008 | Pherson et al. |
| 2008/0186083 A1* | 8/2008 | Rozen .................. G06F 1/3203 327/540 |
| 2010/0115180 A1 | 5/2010 | Lee et al. |
| 2011/0060927 A1 | 3/2011 | Fillingim et al. |
| 2011/0141827 A1 | 6/2011 | Mozak et al. |
| 2011/0276815 A1 | 11/2011 | Wilcox |
| 2012/0311357 A1 | 12/2012 | Andrews |
| 2012/0331207 A1 | 12/2012 | Lassa et al. |
| 2013/0060994 A1* | 3/2013 | Higgins .............. G06F 12/0246 711/103 |
| 2013/0080680 A1 | 3/2013 | Chu |
| 2013/0326459 A1 | 12/2013 | Bickford et al. |
| 2014/0098600 A1* | 4/2014 | Kim .................... G11C 11/1695 365/158 |
| 2014/0185389 A1 | 7/2014 | Jeon et al. |
| 2015/0287444 A1* | 10/2015 | Lee ......................... G11C 7/08 713/322 |
| 2016/0061667 A1* | 3/2016 | Hwang ................... G01K 7/00 374/183 |

\* cited by examiner

FIG. 4

| Voltage | Temperature | Frequency | | | | | | |
|---|---|---|---|---|---|---|---|---|
| | | 400Mbps | 440Mbps | 480Mbps | 533Mbps | 566Mbps | 600Mbps | 667Mbps |
| 1.8V | RT | Pass | Pass | Pass | Pass | Pass | Pass | Pass |
| | Hot/Cold | Pass | Pass | Pass | Pass | Pass | Pass | |
| 1.7V | RT | Pass | Pass | Pass | Pass | | | |
| | Hot/Cold | Pass | Pass | Pass | | | | |

| Voltage | Temperature | CMD1 | | Frequency | | | | | | |
|---|---|---|---|---|---|---|---|---|---|---|
| | | | | 400Mbps | 440Mbps | 480Mbps | 533Mbps | 566Mbps | 600Mbps | 667Mbps |
| 1.7V | RT | Write | | Pass | Pass | Pass | Pass | Pass | Pass | |
| | | Read | | Pass | Pass | Pass | Pass | Pass | | |
| | Hot/Cold | Write | | Pass | Pass | Pass | Pass | | | |
| | | Read | | Pass | Pass | | | | | |

TB2

STORAGE DEVICE AND CONTROLLING METHOD THEREOF

CROSS-REFERENCE TO RELATED APPLICATIONS

A claim for priority under 35 U.S.C. §119 is made to Korean Patent Application No. 10-2014-0126730 filed Sep. 23, 2014, in the Korean Intellectual Property Office, and U.S. provisional patent application No. 62/031,293, filed on Jul. 31, 2014, the entire contents of both of which are hereby incorporated by reference.

BACKGROUND

Example embodiments relate to a storage device. For example, at least some example embodiments relate to a storage device including a nonvolatile memory and a control method thereof.

A semiconductor memory device is a memory device, which is fabricated using semiconductors, such as silicon (Si), germanium (Ge), gallium arsenide (GaAs), and indium phosphide (InP). Semiconductor memory devices may be classified into volatile memory devices and nonvolatile memory devices.

The volatile memory devices may lose stored contents at power-off. The volatile memory devices include the following: a static RAM (SRAM), a dynamic RAM (DRAM), and a synchronous DRAM (SDRAM). The nonvolatile memory devices may retain stored contents even at power-off. The nonvolatile memory devices include the following: a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

In general, a nonvolatile memory is set with an operating speed that allows an environment-free operation to ensure reliability of the operation. However conventionally, the nonvolatile memory may have an operating speed set based on a worst case environment without regard to factors that may allow the nonvolatile memory to reliably operate at a higher operating speed.

SUMMARY

At least some example embodiments are directed to a storage device which includes a nonvolatile memory and a memory controller.

In some example embodiments, the nonvolatile memory is adapted to perform a read operation, a write operation, and an erase operation. The memory controller is adapted to change an operating frequency of the nonvolatile memory by means of a voltage level of a voltage signal and a temperature of the nonvolatile memory, in an operating mode where the memory controller exchanges the voltage signal with the nonvolatile memory or receives the voltage signal from an external device.

The memory controller may increase the operating frequency of the nonvolatile memory as a voltage level of the voltage signal comes close to a reference voltage level.

The memory controller may increase the operating frequency of the nonvolatile memory as the temperature comes close to a room temperature.

The storage device may further include a voltage detector adapted to detect a voltage level of the voltage signal and a temperature sensor adapted to sense the temperature.

The memory controller may include a memory interface. The memory interface may output a control signal, having an operating frequency determined depending on a voltage level of the voltage signal and the temperature, to the nonvolatile memory.

The control signal of the determined operating frequency may be a data strobe signal upon writing and a read enable signal upon reading.

The memory controller may issue a first command to the nonvolatile memory and determine an operating frequency of the nonvolatile memory depending on whether the first command is a read command or a write command.

The memory controller may include a memory interface. The memory interface may output a control signal, having an operating frequency determined depending on a voltage level of the voltage signal, the temperature, and the first command, to the nonvolatile memory.

An operating frequency of the nonvolatile memory determined by the memory interface when the first command is the write command may be higher than that when the first command is the read command.

The voltage detector and the temperature sensor may be included in the memory controller.

The temperature sensor may be included in the memory controller and the voltage detector is included in the nonvolatile memory device.

The temperature sensor may be included in the nonvolatile memory and the voltage detector is included in the memory controller.

The voltage detector and the temperature sensor may be included in the nonvolatile memory.

The reference voltage level may be about 1.8 V.

Some example embodiments are directed to a control method of a storage device which includes a nonvolatile memory and a memory controller adapted to control the nonvolatile memory.

In some example embodiments the control method includes detecting a voltage level of at least one of a voltage signal transferred from the memory controller to the nonvolatile memory, a voltage signal transferred from the nonvolatile memory to the memory controller, and a power supply voltage applied from an external device to the memory controller; sensing a temperature of the storage device; and determining an operating frequency of the nonvolatile memory depending on the detected voltage level and the sensed temperature.

In determining, the operating frequency of the nonvolatile memory may increase as a voltage level of the voltage signal comes close to a reference voltage level.

In the determining, the operating frequency of the nonvolatile memory may increase as the temperature comes close to a room temperature.

The control method further includes determining whether a first command issued from the memory controller to the nonvolatile memory is a read command or a write command. In the determining, an operating frequency of the nonvolatile memory may be determined depending on whether the first command is the read command or the write command.

In the determining, an operating frequency of the nonvolatile memory when the first command is a write command may be higher than that when the first command is a read command.

In the determining, a frequency of a data strobe signal to be transferred to the nonvolatile memory may be changed upon writing, and a frequency of a read enable signal to be transferred to the nonvolatile memory may be changed upon reading.

A storage device includes a nonvolatile memory and a memory controller. The nonvolatile memory is adapted to perform a read operation, a write operation, and an erase operation in response to a first command. The memory controller is adapted to output the first command to the nonvolatile memory and set an operating frequency of the nonvolatile memory when the first command is a write command, to be higher than an operating frequency of the nonvolatile memory when the first command is a read command.

The memory controller may include a memory interface, and the memory interface may output a control signal, having an operating frequency determined depending on the first command, to the nonvolatile memory.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 4 is a diagram showing a first table according to some example embodiments;

FIG. 5 is a diagram showing a second table according to some example embodiments;

DETAILED DESCRIPTION

Figure 1:
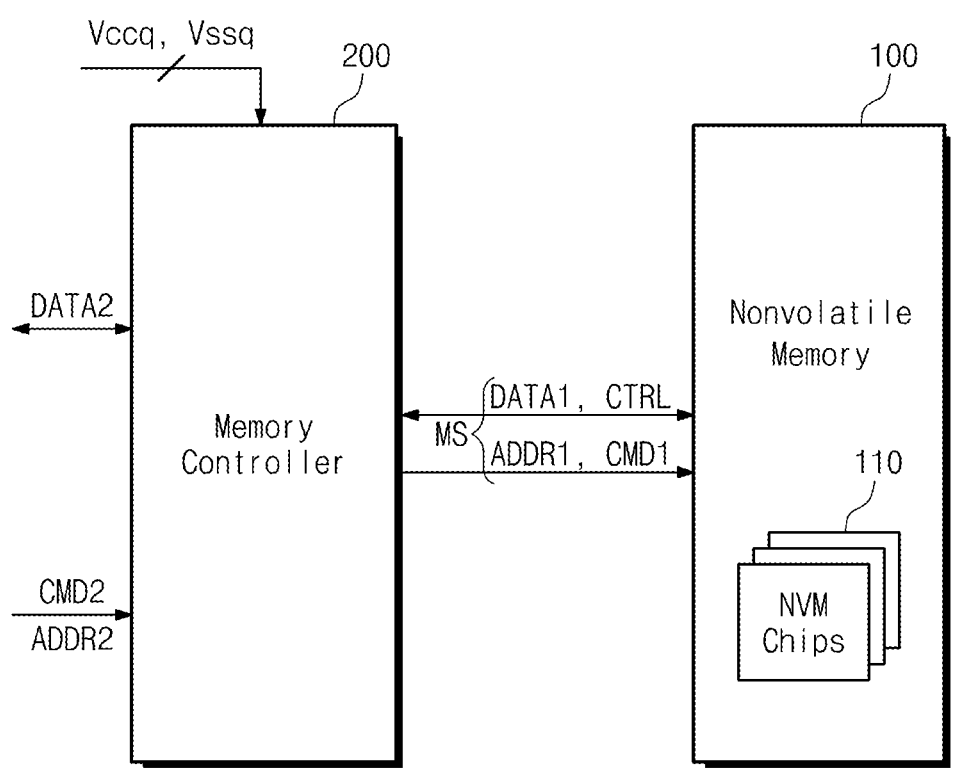
FIG. 1 is a block diagram schematically illustrating a storage device according to some example embodiments.

Example embodiments will be described in detail with reference to the accompanying drawings. Example embodiments of the inventive concepts, however, may be embodied in various different forms, and should not be construed as being limited only to the illustrated embodiments. Rather, these example embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device 10 according to some example embodiments of the inventive concepts.

Referring to FIG. 1, a storage device 10 contains a nonvolatile memory 100 and a memory controller 200.

The nonvolatile memory 100 performs read, write, and erase operations under a control of the memory controller 120. The nonvolatile memory 100 receives a memory signal MS from the memory controller 200 and outputs the memory signal MS to the memory controller 200. The memory signal MS includes at least one of first data DATA1, a first address ADDR1, and a first command CMD1, and a control signal CTRL.

The nonvolatile memory 100 exchanges the first data DATA1 with the memory controller 200. For example, the nonvolatile memory 100 may perform a write operation to store write data provided from the memory controller 200. Further, the nonvolatile memory 100 may perform a read operation and provide the memory controller 200 with data read through the read operation.

The nonvolatile memory 100 receives the first command CMD1 and the first address ADDR1 from the memory controller 200. The nonvolatile memory 100 exchanges the control signal CTRL with the memory controller 200.

For example, the first command CMD1 received by the nonvolatile memory 110 from the memory controller 200 may include at least one of a chip selection signal /CE for selecting at least one of a plurality of semiconductor chips constituting the nonvolatile memory 100, a command latch enable signal CLE indicating that a signal received from the memory controller 200 is the first command CMD1, an address latch enable signal ALE indicating that a signal received from the memory controller 200 is the first address ADDR1, a read enable signal nRE received from the memory controller 200 at the read operation, periodically toggled, and used to tune timing, a write enable signal nWE activated by the memory controller 200 upon transmission of the first command CMD1 or the first address ADDR1, a write protection signal /WP activated by the memory controller 200 to prevent unintended writing or erasing when a power is changed, and a data strobe signal DQS used to adjust input synchronization of the first data DATA1, periodically toggled, and generated by the memory controller 200.

Further, the control signal CTRL output by the nonvolatile memory 100 to the memory controller 200 may include at least one of a ready/busy signal R/nB indicating whether the nonvolatile memory 100 performs a program, erase or read operation and a data strobe signal DQS used to adjust output synchronization of the first data DATA1, periodically toggled, and generated by the nonvolatile memory 100 depending on a read enable signal /RE.

The nonvolatile memory 100 includes a plurality of nonvolatile memory chips 110. Each of the nonvolatile memory chips 110 may include a flash memory. However, the scope and spirit of example embodiments of the inventive concepts may not be limited thereto. For example, each of the nonvolatile memory chips 110 may incorporate at least one of nonvolatile memories, such as PRAM (Phase-change RAM), MRAM (Magnetic RAM), RRAM (Resistive RAM), and FeRAM (Ferroelectric RAM).

The memory controller 200 is configured to control the nonvolatile memory 100. For example, under a control of the memory controller 200, the nonvolatile memory 100 performs a read, write, and/or erase operation. The memory controller 200 exchanges the first data DATA1 and the control signal CTRL with the nonvolatile memory 100; and the memory controller 200 outputs the first command CMD1 and the first address ADDR1 to the nonvolatile memory 100.

The memory controller 200 controls the nonvolatile memory 110 in compliance with a control of an external host device (not shown). The memory controller 200 exchanges second data DATA2 with the host device and receives a second command CMD2 and a second address ADDR2 from the host device. The memory controller 200 also receives a power supply voltage Vccq and a ground voltage Vssq from the host device. The power supply voltage Vccq may be set to 1.8 V or 3.3 V in compliance with an operating mode.

The memory signal MS exchanged between the memory controller 200 and the nonvolatile memory 100 may be generated depending on the power supply voltage Vccq and the ground voltage Vssq. For this reason, the memory signal MS of a high state has a voltage level of the power supply voltage Vccq, and the memory signal MS of a low state has a voltage level of the ground voltage Vssq.

Below, a mode where a high state of the memory signal MS and a voltage level of the power supply voltage Vccq are set to 1.8 V may be referred to as a first mode, and a mode where a high state of the memory signal MS and a voltage level of the power supply voltage Vccq are set to 3.3 V may be referred to as a second mode.

The memory controller 200 may operate in at least one of the first and second modes. In example embodiments, an operating speed of the memory controller 200 that operates in the first mode may be faster than in the second mode. Below, an example embodiment where the memory controller 200 operates in the first mode will be described.

When the memory controller 200 operates in the first mode, ideally, a high state of the memory signal MS and a voltage level of the power supply voltage Vccq may have 1.8 V. However, a high state of the memory signal MS and a voltage level of the power supply voltage Vccq may be higher or lower than 1.8 V within an allowable range. When the nonvolatile memory 100 is a NAND flash memory, an allowable range of the first mode is higher than or equal to 1.7 V and lower than or equal to 1.95 V.

A maximum of operating frequency of the nonvolatile memory 100 may vary with a high state of the memory signal MS or an actual voltage level of the power supply voltage Vccq in the first mode. Also, a maximum of operating frequency of the nonvolatile memory 100 may vary with a temperature of the nonvolatile memory 100.

When operating in the first mode, the storage device 10 may optimize an operating frequency of the nonvolatile memory 100 depending on a high state of the memory signal MS or an actual voltage level of the power supply voltage Vccq and a temperature of the nonvolatile memory 100.

The storage device 10 performs an operation of writing, reading or erasing data in compliance with a request of the host device. The storage device 10 may include a solid state drive (SSD) or a hard disk drive (HDD). The SSD may include memory cards, such as PC card (PCMCIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, and universal flash storage (UFS). The SSD may include embedded memories, such as eMMC (embedded MultiMedia Card), UFS, and PPN (Perfect Page New).

In some example embodiments, the nonvolatile memory 100 may be a three dimensional (3D) memory array. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In some example embodiments, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 2:
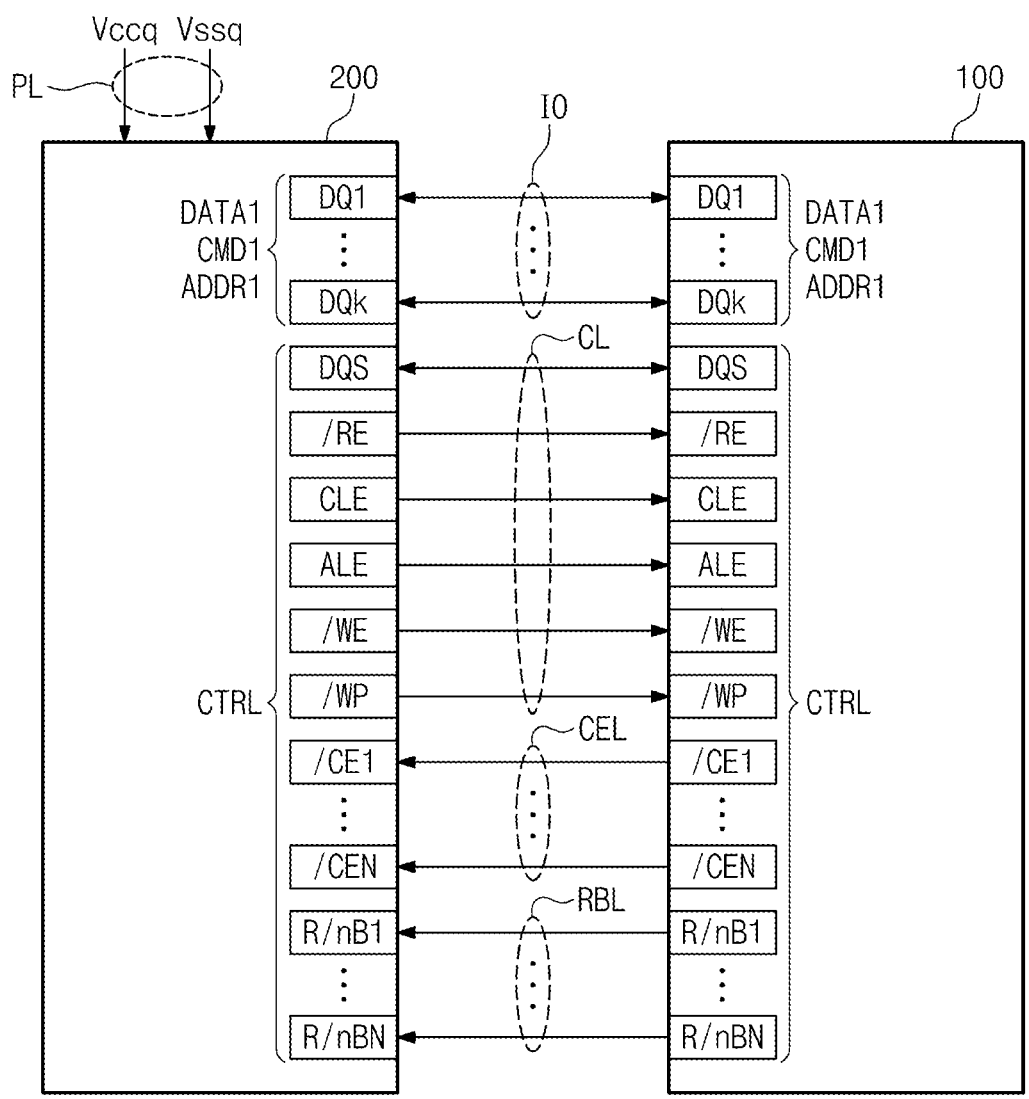
FIG. 2 is a block diagram schematically illustrating an interconnection between a memory controller and a nonvolatile memory.

FIG. 2 is a block diagram schematically illustrating an interconnection between a memory controller 200 and a nonvolatile memory 100.

Referring to FIG. 2, information exchange between a memory controller 200 and a nonvolatile memory 100 may be made in common through input/output lines IO. For example, exchanged are first data DATA1, a first command CMD1, and a first address ADDR1 between the memory controller 200 and the nonvolatile memory 100 through the input/output lines IO.

Each of the memory controller 200 and the nonvolatile memory 100 contains a plurality of input/output pads DQ1 through DQk. For example, the number of the input/output pads DQ1 through DQk may be 8, 16, or 32. However, the scope and spirit of the example embodiments of the inventive concepts may not be limited thereto.

The input/output pads DQ1 through DQk of the memory controller 200 are connected to the input/output pads DQ1 through DQk of the nonvolatile memory 100 through the input/output lines IO, respectively. The first data DATA1, the first command CMD1, and the first address ADDR1 are exchanged between the memory controller 200 and the nonvolatile memory 100 through the input/output pads DQ1 through DQk and the input/output lines IO.

The signals transmitted through the input/output pads DQ1 through DQk and the input/output lines IO may be identified as one of the first data DATA1, first command CMD1, or first address ADDR1 according to a shape of the control signal CTRL.

Between the memory controller 200 and the nonvolatile memory 100, the control signal CTRL is exchanged through control lines CL, chip enable lines CEL, and ready/busy lines RBL. Each of the memory controller 200 and the nonvolatile memory 100 contains pads for transmitting the control signals, including pads associated with a data strobe signal DQS, a read enable signal /RE, a command latch enable signal CLE, an address latch enable signal ALE, a write enable signal /WE, and a write protection signal /WP. Corresponding pads of the memory controller 200 and the nonvolatile memory 100 are connected through the control lines CL, respectively.

Each of the memory controller 200 and the nonvolatile memory 100 contains pads for transmitting chip enable signals /CE1 through /CEN, and corresponding pads of the memory controller 200 and the nonvolatile memory 100 are connected through the chip enable lines CEL, respectively.

Each of the memory controller 200 and the nonvolatile memory 100 contains pads for exchanging ready/busy signals R/nB1 through R/nBN, and corresponding pads of the memory controller 200 and the nonvolatile memory 100 are connected through the ready/busy lines RBL, respectively.

The memory controller 200 is supplied with a power supply voltage Vccq and a ground voltage Vssq through a power line PL.

Figure 3:
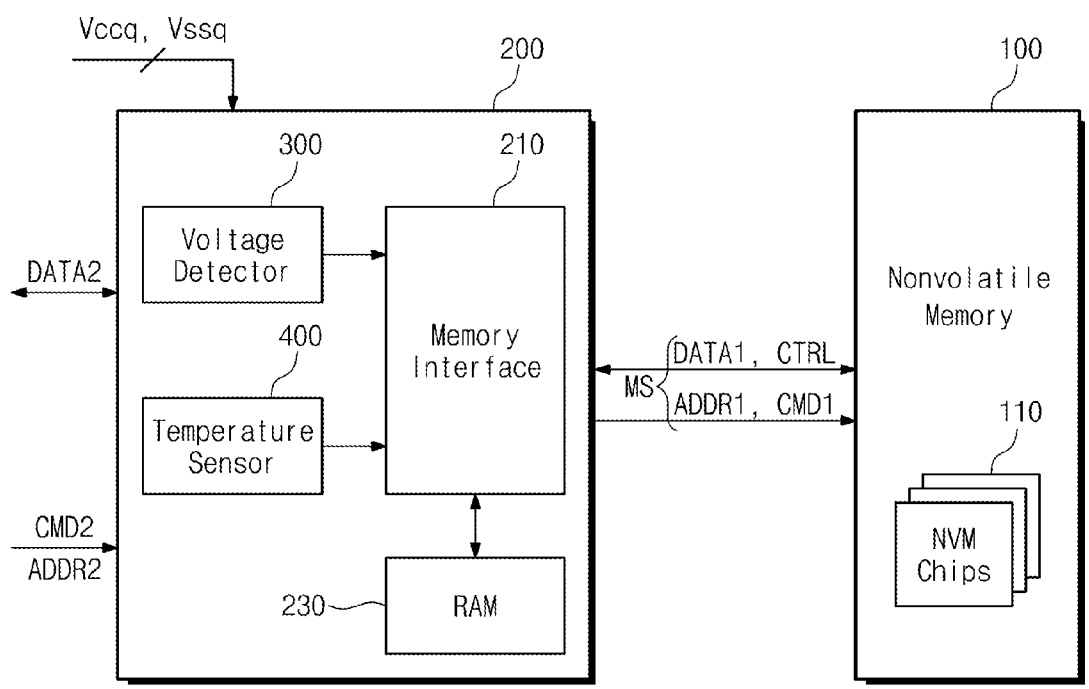
FIG. 3 is a block diagram of a storage device where a memory controller according to some example embodiments.

FIG. 3 is a block diagram of a storage device 10 where a memory controller according to some example embodiments is in detail illustrated.

Referring to FIG. 3, the storage device 10 includes the controller 200 and the non-volatile memory 100.

The memory controller 200 contains a memory interface 210, a voltage detector 300, and a temperature sensor 400.

The memory interface 210 manages an overall operation associated with communications with a nonvolatile memory 100. The memory interface 210 outputs the first command CMD1 and the first address ADDR1 to the nonvolatile memory 100. The memory interface 210 exchanges the first data DATA1 and the control signal CTRL with the nonvolatile memory 100.

The memory interface 210 determines an operating frequency of the nonvolatile memory 100. The memory interface 210 controls a frequency of at least one of the first command CMD1, the first address ADDR1, the first data DATA1, and the control signal CTRL to determine an operating frequency of the nonvolatile memory 100. For example, when the first command CMD1 is a write command, the memory interface 210 may adjust a frequency of a data strobe signal DQS to determine an operating frequency of the nonvolatile memory 100. When the first command CMD1 is a read command, the memory interface 210 adjusts a frequency of a read enable signal /RE to determine an operating frequency of the nonvolatile memory 100.

The voltage detector 300 detects a high state of a memory signal MS or a voltage level of the power supply voltage Vccq and outputs the information about the voltage level thus detected to the memory interface 210.

The voltage detector 300 is connected to at least one of input/output lines IO, control lines CL, chip enable lines CEL, and ready/busy lines RBL shown in FIG. 2 and detects a voltage level of a memory signal MS having a high state. The voltage detector 300 is also connected to a power line PL to which the power supply voltage Vccq is applied and detects a voltage level of the power supply voltage Vccq.

The voltage detector 300 may be implemented in the memory controller 200. The voltage detector 300 may be implemented with a variety of circuits or elements.

The temperature sensor 400 senses a temperature of the nonvolatile memory 100. The temperature sensor 400 may sense a temperature of the nonvolatile memory 100 and/or a temperature of the memory controller 200 as a temperature of the nonvolatile memory 100. The temperature sensor 400 outputs the information about the temperature thus sensed to the memory interface 210.

The temperature sensor 400 may be implemented in the memory controller 200. The temperature sensor 400 may be implemented with a variety of circuits or elements.

The memory controller 200 further contains a RAM 230. The RAM 230 is used as a working memory, a cache memory, and/or a buffer memory. The RAM 230 stores data or codes needed to manage the nonvolatile memory 100. For example, the memory controller 200 reads, from the nonvolatile memory 100, data or codes needed to manage the nonvolatile memory 100 and loads the read data or codes on the RAM 230 for driving.

FIG. 4 is a diagram showing a first table TB1 according to some example embodiments.

Referring to FIGS. 3 and 4, the RAM 230 stores a first table TB1 that indicates desired frequencies of a nonvolatile memory 100 depending on voltages and temperature when a memory controller 200 operates in a first mode. In the first table TB1, "RT" denotes a room temperature. The controller 200 may load the first table TB1 stored in the nonvolatile memory 100 on the RAM 230.

A memory interface 210 may improve (or, alternatively, optimize) an operating frequency of the nonvolatile memory 100 depending on voltage level information and temperature information. That is, an operating frequency of the nonvolatile memory 100 varies with voltage level information and temperature information. The memory interface 210 reads a desired (or, alternatively, an optimal) frequency, which is determined depending on voltage level information from a voltage detector 300 and temperature information from a temperature sensor 400, from the first table TB1. The memory interface 210 generates a control signal CTRL having the desired frequency thus read. The control signal CTRL having the desired frequency may be the data strobe signal DQS upon writing and the read enable signal /RE upon reading.

The memory interface 210 determines an operating frequency of the nonvolatile memory 100, depending on a gap between 1.8 V (a reference voltage level or an ideal voltage level) and a voltage level. For example, an operating frequency determined when a first voltage gap exists between 1.8 V and a voltage level in a first mode is higher than that determined when a second voltage gap greater than the first voltage gap exists between 1.8 V and the voltage level. The closer to 1.8 V the voltage level, the higher an operating frequency of the nonvolatile memory 100.

Further, the memory interface 210 determines the operating frequency of the nonvolatile memory 100, depending on a gap between a temperature of a storage device 10 and a room temperature. For example, an operating frequency determined when a first temperature gap exists between a temperature of the storage device 10 and the room temperature is higher than that determined when a second temperature gap greater than the first temperature gap exists between a temperature of the storage device 10 and the room temperature. The closer to the room temperature a temperature of a storage device 10, the higher an operating frequency of the nonvolatile memory 100.

As illustrated in the last column of FIG. 4, when a memory signal MS of a high state and a power supply voltage Vccq have a voltage level of 1.8 V and a temperature is a room temperature, the nonvolatile memory 100 operates at a maximum frequency of about 667 Mbps. Further, as illustrated in the second to last column of FIG. 4, when a memory signal MS of a high state and a power supply voltage Vccq have a voltage level of 1.8 V and a temperature is not a room temperature, the nonvolatile memory 100 operates at a maximum frequency of about 600 Mbps.

As illustrated in the third to last column of FIG. 4, when a memory signal MS of a high state and a power supply voltage Vccq have a voltage level of 1.7 V and a temperature is a room temperature, the nonvolatile memory 100 operates at a maximum frequency of about 553 Mbps. Further, as illustrated in the fourth to last column of FIG. 4, when a memory signal MS of a high state and a power supply voltage Vccq have a voltage level of 1.7 V and a temperature is not a room temperature, the nonvolatile memory 100 operates at a maximum frequency of about 480 Mbps.

Shown in the first table TB1 are desired (or, alternatively, optimal) frequencies determined when a memory signal MS of a high state and a power supply voltage Vccq have a voltage level of 1.8 V or 1.7 V. However, the scope and spirit of example embodiments of the inventive concepts may not be limited thereto. Optimal frequencies may be finely determined by finely dividing a voltage within a range from 1.7 V to 1.95 V as an allowable range of a first mode. Shown in the first table TB1 are desired (or, alternatively, optimal) frequencies determined when a temperature is a room temperature RT and is not a room temperature Hot/Cold. However, the scope and spirit of example embodiments of the inventive concepts may not be limited thereto. Optimal frequencies may be finely determined by finely dividing a temperature that is not a room temperature.

Conventionally, a memory controller may not factor a voltage level of one of the memory signal MS having a high state or a voltage level of the power supply voltage Vccq and a temperature when determining an operating frequency of the nonvolatile memory 100. Therefore, a conventional memory controller may set an operating frequency of the nonvolatile memory 100 as 480 Mbps based on a worst case scenario, that is, as illustrated in FIG. 4, when a voltage level of the first mode is 1.7 V and a temperature is not a room temperature.

In contrast, the memory controller 200 according to some example embodiments of the inventive concepts changes an operating frequency of the nonvolatile memory 100 depending on a voltage level of one of the memory signal MS having a high state or the power supply voltage Vccq and a temperature, thereby improving read and write speeds.

FIG. 5 is a diagram showing a second table TB2 according to some example embodiments.

Referring to FIGS. 3 and 5, the RAM 230 may store a second table TB2 that includes desired (or, alternatively, optimal) frequencies of the nonvolatile memory 100 operating in the first mode. The desired (or, alternatively, optimal) frequencies may be determined depending not only on voltages, and temperatures, but also based on a first command CMD1. The controller 200 may load the second table TB1 stored at the nonvolatile memory 100 on the RAM 230.

A memory interface 210 may improve (or, alternatively, optimize) the operating frequency of the nonvolatile memory 100 depending on the first command CMD1. That is, the operating frequency of the nonvolatile memory 100 varies with whether the first command CMD1 is a write command or a read command, as well as voltage level information and temperature information. The memory interface 210 reads a desired (or, alternatively, an optimal) frequency, which is determined depending on the first command CMD1, voltage level information, and temperature information, from the second table TB2. The memory interface 210 generates a control signal CTRL having the desired (or, alternatively, optimal) frequency thus read. The control signal CTRL having the desired (or, alternatively, optimal) frequency may be the data strobe signal DQS upon writing and the read enable signal /RE upon reading.

The memory interface 210 sets an operating frequency of the nonvolatile memory when the first command CMD1 is a write command, to be higher than that when the first command CMD1 is a read command.

As illustrated in the second to last column of FIG. 5, when a memory signal MS of a high state and a power supply voltage Vccq have a voltage level of 1.7 V, a temperature is a room temperature, and the first command CMD1 is a write command, the nonvolatile memory 100 operates at a maximum frequency of about 600 Mbps. Further, as illustrated in the fourth to last column of FIG. 5, when a memory signal MS of a high state and a power supply voltage Vccq have a voltage level of 1.7 V, a temperature is a room temperature, and the first command CMD1 is a read command, the nonvolatile memory 100 operates at a maximum frequency of about 533 Mbps.

As illustrated in the third to last column of FIG. 5, when a memory signal MS of a high state and a power supply voltage Vccq have a voltage level of 1.7 V, a temperature is not a room temperature Hot/Cold, and the first command CMD1 is a write command, the nonvolatile memory 100 operates at a maximum frequency of about 566 Mbps. Further, as illustrated in the fifth to last column of FIG. 5, when a memory signal MS of a high state and a power supply voltage Vccq have a voltage level of 1.7 V, a temperature is not a room temperature, and the first command CMD1 is a read command, the nonvolatile memory 100 operates at a maximum frequency of about 480 Mbps.

Shown in the second table TB2 are desired (or, alternatively, optimal) frequencies determined when a memory signal MS of a high state and a power supply voltage Vccq have a voltage level of 1.7 V. However, the scope and spirit of the example embodiments of the inventive concepts may not be limited thereto. Optimal frequencies may be finely determined by finely dividing a voltage within a range from 1.7 V to 1.95 V as an allowable range of a first mode. Shown in the second table TB2 are desired (or, alternatively, optimal) frequencies determined when a temperature is a room temperature and is not a room temperature Hot/Cold. However, the scope and spirit of example embodiments of the inventive concepts may not be limited thereto. Optimal frequencies may be finely determined by finely dividing a temperature that is not a room temperature.

Conventionally, a memory controller a memory controller may not factor the first command CMD1 when determining an operating frequency of the nonvolatile memory 100. In contrast, a conventional the memory controller may set an operating frequency of the nonvolatile memory 100 to 480 Mbps (refer to the second table TB2) at the worst case, that is, when a voltage level of the first mode is 1.7 V, a temperature is not a room temperature, and the first command CMD1 is a read command.

In contrast, the memory controller 200 according to some example embodiments of the inventive concepts changes an operating frequency of the nonvolatile memory 100 depending on whether the first command CMD1 is a write command or a read command, as well as a voltage level and a temperature, thereby improving read and write speeds.

Figure 6:
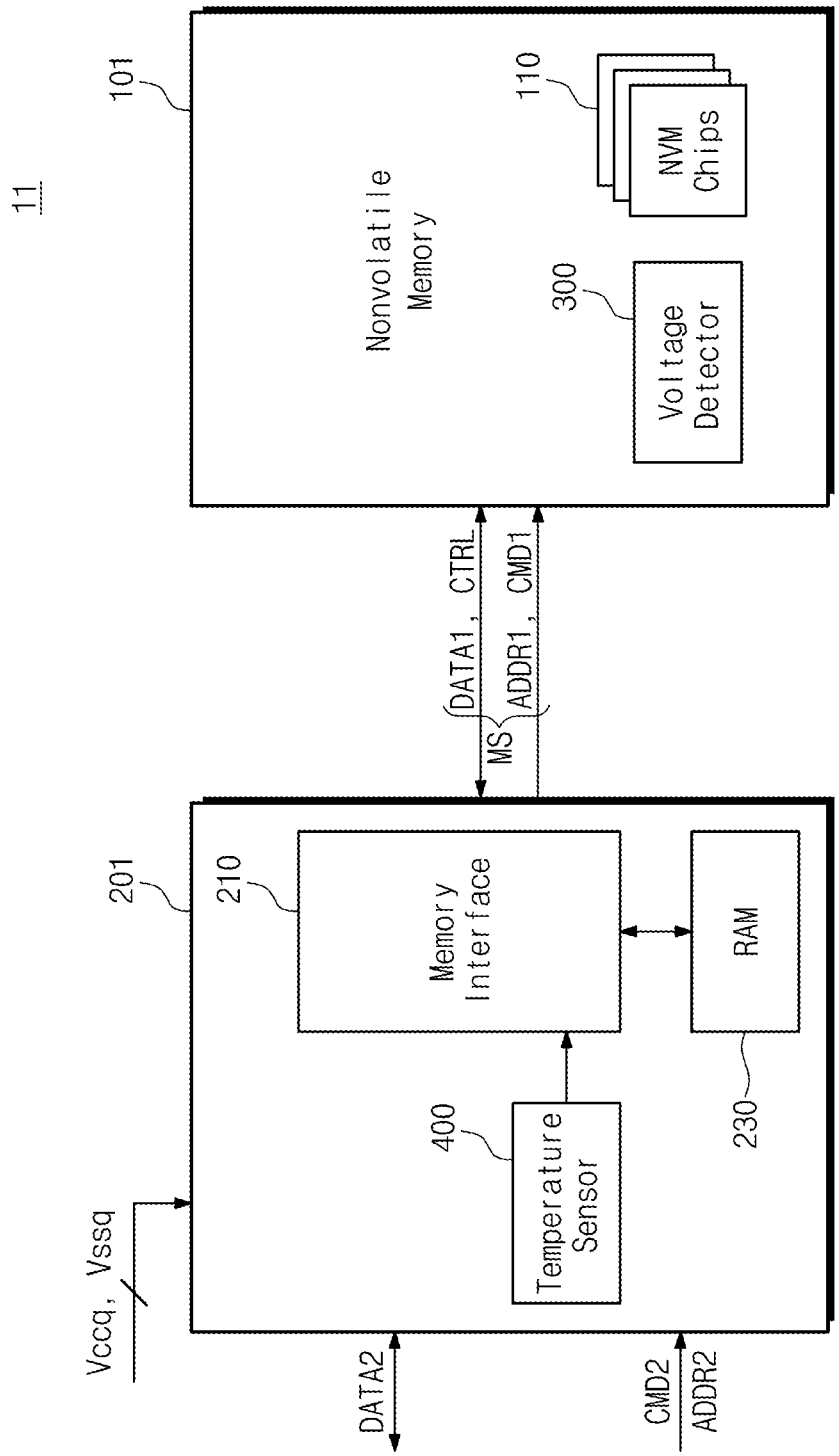
FIGS. 6 to 8 are block diagrams schematically illustrating storage devices according to some example embodiments.
Figure 7:
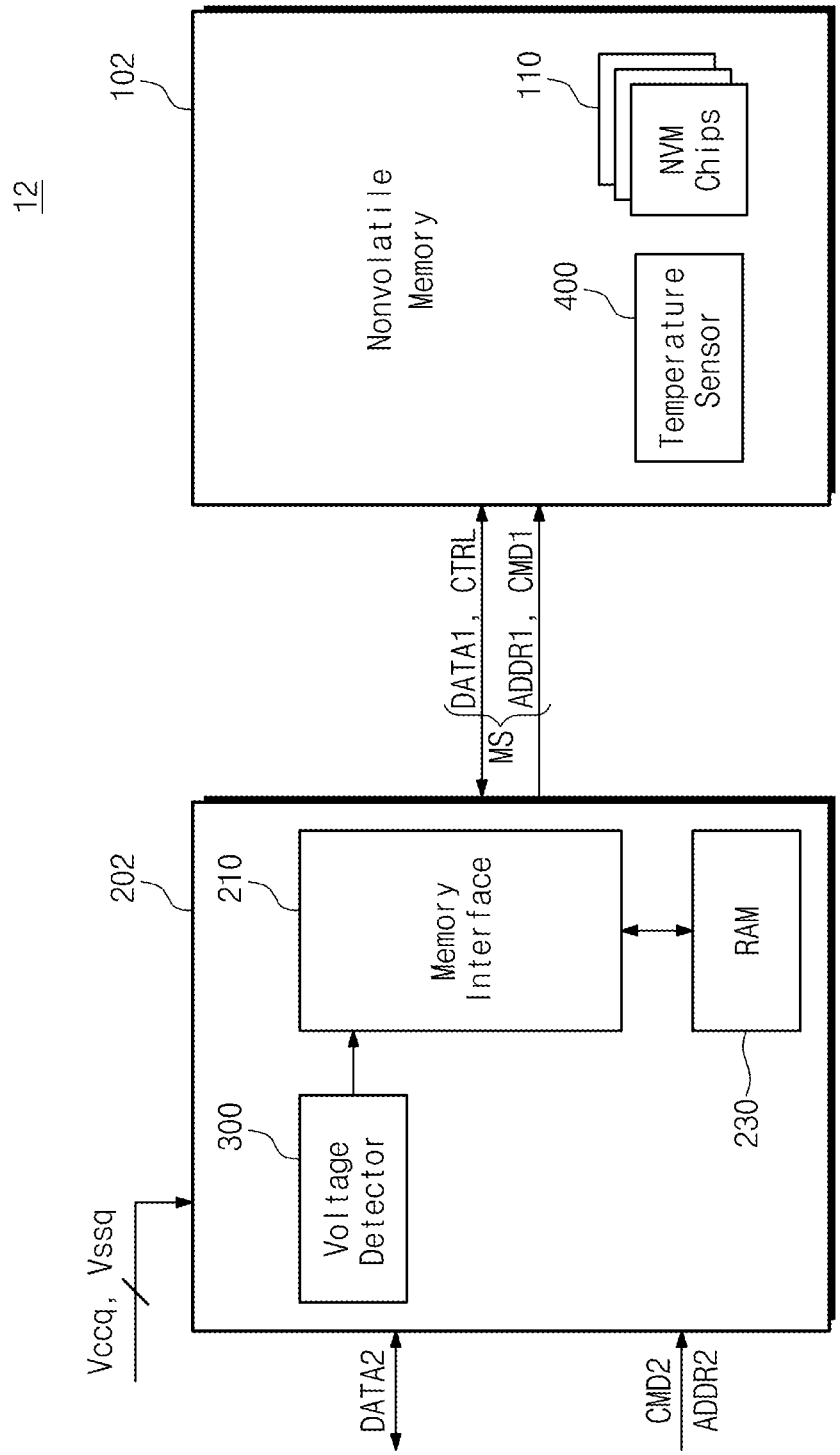
Figure 8:
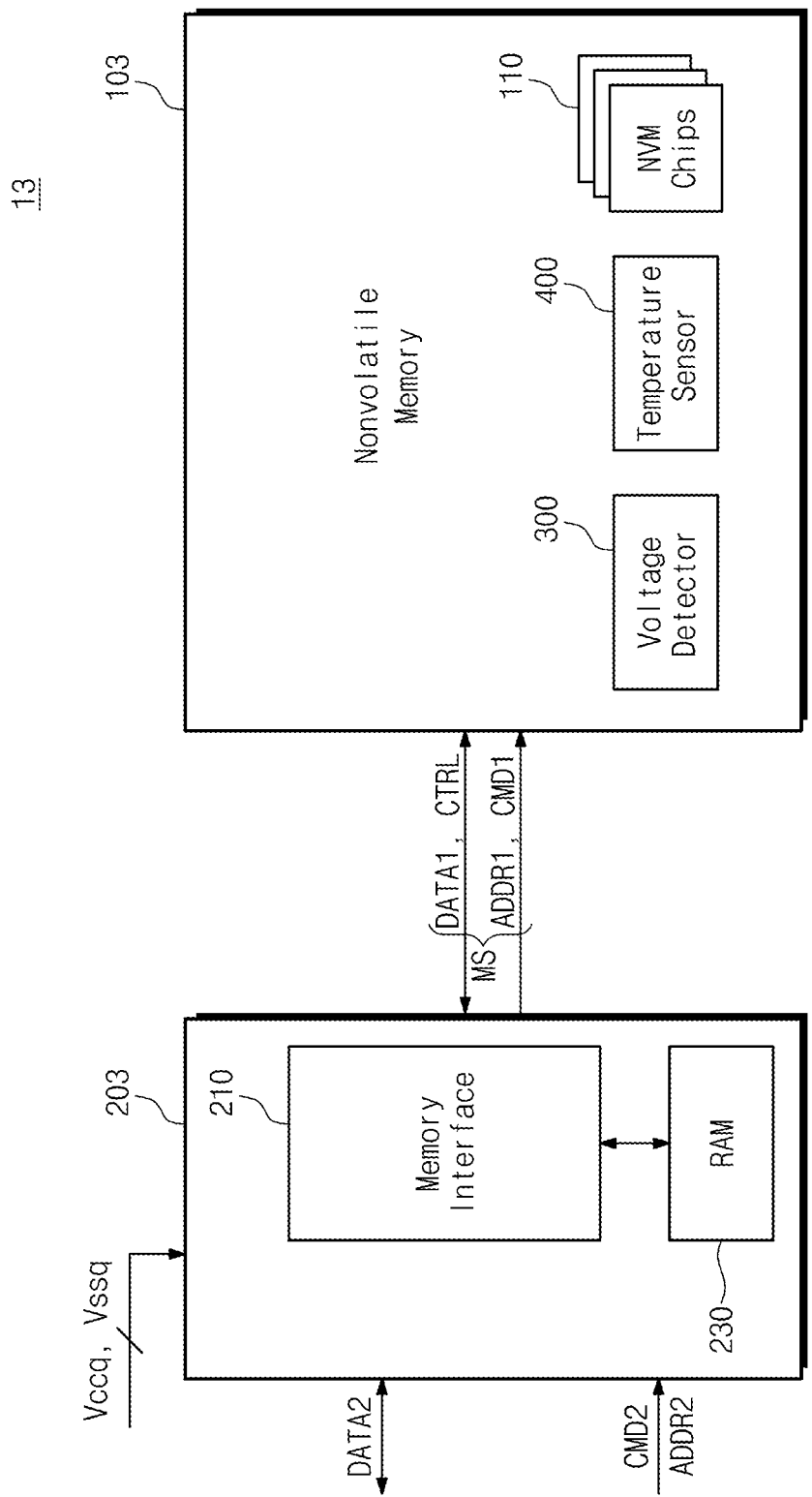

FIGS. 6 to 8 are block diagrams schematically illustrating storage devices 11 through 13 according to other example embodiments. Differences between storage devices 11 through 13 shown in FIGS. 6 through 8 and a storage device 10 described with reference to FIGS. 1 through 3 will be focused.

Referring to FIG. 6, a storage device 11 contains a memory controller 201 and a nonvolatile memory 101. In the storage device 11 shown in FIG. 6, a voltage detector 300 is included in the nonvolatile memory 101. The voltage detector 300 detects a voltage level of a memory signal MS having a high state and/or a voltage level of a power supply voltage Vccq and outputs the detected voltage level to a memory interface 210 through input/output lines IO (refer to FIG. 2). In the storage device 11 shown in FIG. 6, a temperature sensor 400 is included in the memory controller 201. Therefore the storage device 11 may accurately detect the voltage of the memory signal MS received by the non-volatile memory 101.

Referring to FIG. 7, the storage device 12 contains a memory controller 202 and a nonvolatile memory 102. In the storage device 12 shown in FIG. 7, a voltage detector 300 is included in the memory controller 202. In the storage device 12 shown in FIG. 7, a temperature sensor 400 is included in the nonvolatile memory 102. The temperature sensor 400 senses a temperature and outputs information about the detected temperature to a memory interface 210 through input/output lines IO (refer to FIG. 2). Therefore the storage device 12 may accurately detect the temperature of the nonvolatile memory 102.

Referring to FIG. 8, the storage device 13 contains a memory controller 203 and a nonvolatile memory 103. In the storage device 13 shown in FIG. 8, a voltage detector 300 is included in the nonvolatile memory 103. The voltage detector 300 detects a voltage level of a memory signal MS having a high state or a voltage level of a power supply voltage Vccq and outputs the detected voltage level to a memory interface 210 through input/output lines IO (refer to FIG. 2). In the storage device 13 shown in FIG. 8, a temperature sensor 400 is included in the nonvolatile memory 103. The temperature sensor 400 senses a temperature and outputs information about the detected temperature to the memory interface 210 through the input/output lines IO. Therefore the storage device 13 may accurately detect the voltage of the memory signal MS received by the non-volatile memory 103 and the temperature of the non-volatile memory 103.

Figure 9:
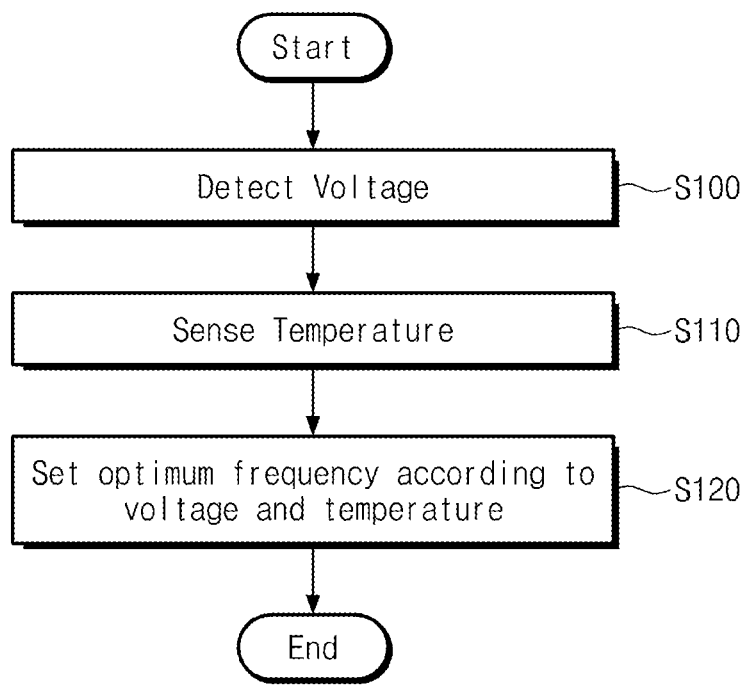
FIG. 9 is a flow chart showing a control method of a storage device according to some example embodiments.

FIG. 9 is a flow chart showing a control method of a storage device according to some example embodiments.

Referring to FIGS. 1 through 4 and 9, a memory controller 200 may operate in a first mode.

In step S100, a voltage detector 300 may detect a voltage level of at least one of a signal of a first voltage level provided from the memory controller 200 to a nonvolatile memory 100, a signal of the first voltage level provided from the nonvolatile memory 100 to the memory controller 200, and a power supply voltage of the first voltage level applied from an external device to the memory controller 200. The desired (or alternatively, optimal) first voltage level may be 1.8 V when the memory controller 200 operates in the first mode.

The voltage detector 300 detects a voltage level of a memory system having a high state or a voltage level of a power supply voltage Vccq. For example, since the voltage detector 300 is connected to at least one of input/output lines IO, control lines CL, chip enable lines CEL, and ready/busy lines RBL shown in FIG. 2, the voltage detector 300 may detect a voltage level of the memory signal MS having a high state. Alternatively, since the voltage detector 300 is also connected to a power line PL to which a power supply voltage Vccq is applied, the voltage detector 300 may detect a voltage level of the power supply voltage Vccq.

In step S110, a temperature sensor 400 senses a temperature of a storage device 10. For example, the temperature sensor 400 senses a temperature of the memory controller 200 and/or a temperature of the nonvolatile memory 100. The temperature sensor 400 may sense a temperature of the nonvolatile memory 100 or a temperature of the memory controller 200 as a temperature of the nonvolatile memory 100.

In step S120, a memory interface 210 improves (or, alternatively, optimizes) an operating frequency of the nonvolatile memory 100, depending on information about the detected voltage level and information about the sensed temperature. The memory interface 210 reads a desired (or, alternatively, an optimal) frequency from the first table TB1 illustrated in FIG. 4, depending on information about the detected voltage level and information about the sensed temperature. Afterwards, the memory interface 210 conducts a control operation such that the nonvolatile memory 100 operates at the desired (or, alternatively, optimal) frequency thus read. The closer to 1.8 V the voltage level, the higher an operating frequency of the nonvolatile memory 100.

The closer to the room temperature a temperature of a storage device 10, the higher an operating frequency of the nonvolatile memory 100.

Figure 10:
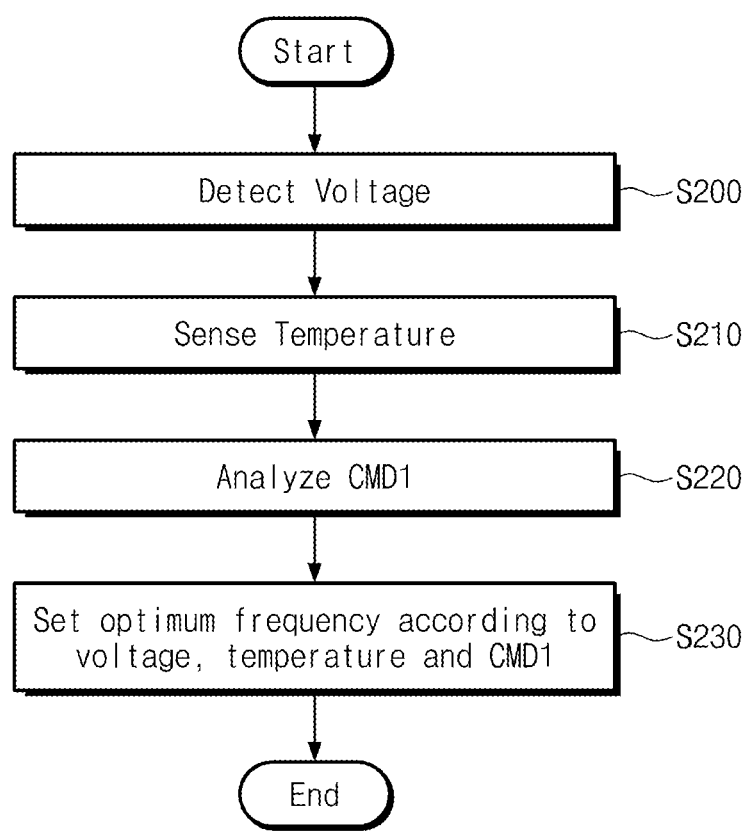
FIG. 10 is a flow chart showing a control method of a storage device according to some example embodiments.

FIG. 10 is a flow chart showing a control method of a storage device according to other example embodiments.

Referring to FIGS. 1 through 3, 5, and 10, a memory controller 200 may operate in a second mode.

Steps 200 and 210 of FIG. 10 are identical to steps 100 and 110 of FIG. 9, and a description thereof is thus omitted.

In step S220, a memory interface 210 analyzes a first command CMD1. In detail, the memory interface 210 determines whether the first command CMD1 is a read command or a write command.

In step S230, the memory interface 210 improves (or, alternatively, optimizes) an operating frequency of a nonvolatile memory 100, depending on information about a detected voltage level, information about a sensed temperature, and the analyzing result about the first command CMD1.

The memory interface 210 reads a desired (or, alternatively, optimal) frequency, which is determined depending on information about a detected voltage level, information about a sensed temperature, and the analyzing result indicating whether the first command CMD1 is a read command or a write command, from the second table TB2 illustrated in FIG. 5. Afterwards, the memory interface 210 conducts a control operation such that the nonvolatile memory 100 operates at the desired (or, alternatively, optimal) frequency thus read.

In example embodiments, the closer to 1.8 V the voltage level, the higher an operating frequency of the nonvolatile memory 100.

In example embodiments, the closer to the room temperature a temperature of a storage device 10, the higher an operating frequency of the nonvolatile memory 100.

In example embodiments, an operating frequency of the nonvolatile memory 100 determined when the first command CMD1 is a write command is higher than that determined when the first command CMD1 is a read command.

Figure 11:
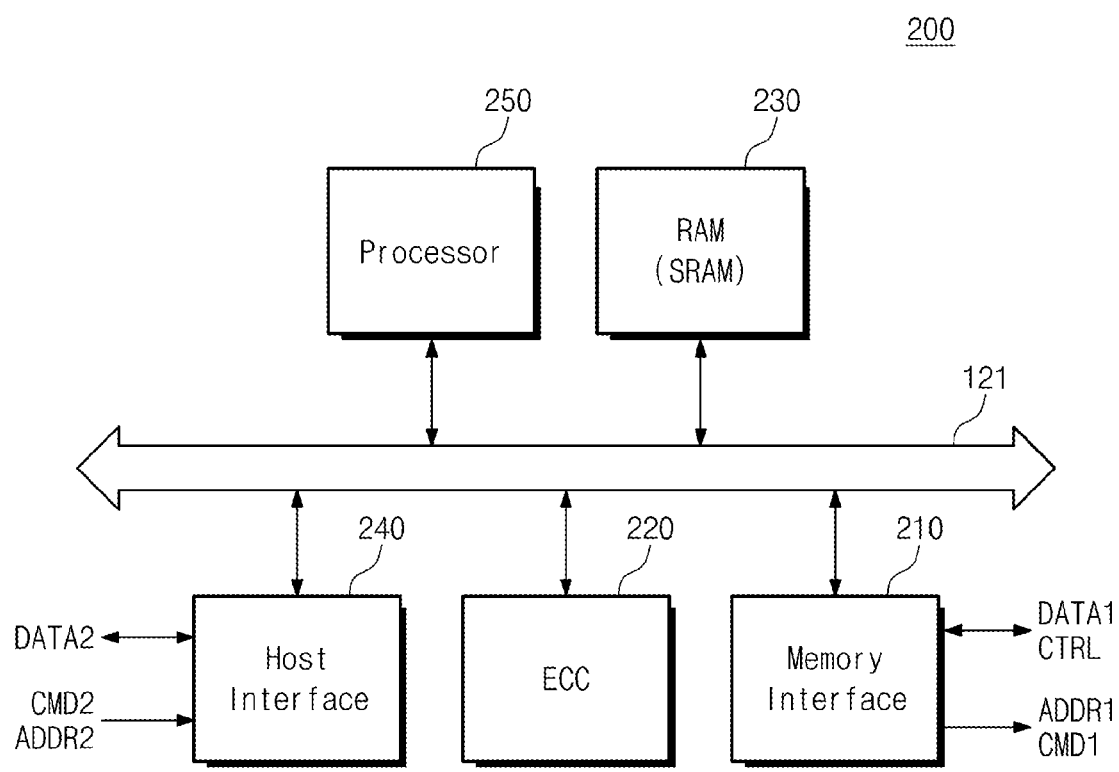
FIG. 11 is a block diagram schematically illustrating a memory controller according to some example embodiments.

FIG. 11 is a block diagram schematically illustrating a memory controller 200 according to some example embodiments.

Referring to FIG. 11, a memory controller 200 contains a bus 121, a memory interface 210, an ECC block 220, a RAM 230, host interface 240, and a processor 250.

The bus 121 may be configured to provide a channel among components of the memory controller 200.

The processor 250 controls an overall operation of the memory controller 200 and executes a logical operation. The processor 250 communicates with an external host through the host interface 240. The processor 250 stores the second command CMD2 and/or the second address ADDR2 received through the host interface 240 at the RAM 230. The processor 250 generates the first command CMD1 and the first address ADDR1 in response to the command or address stored at the RAM 230 and outputs the first command CMD1 and the first address ADDR1 to the nonvolatile memory 100 through the memory interface 210.

The processor 250 may be an arithmetic logic unit, a digital signal processor, a microcomputer, a field programmable array, a programmable logic unit, a microprocessor or any other device capable of responding to and executing instructions in a defined manner such that the processor is programmed with instructions that configure the processor 250 as a special purpose computer to perform the operations illustrated in FIGS. 9 and 10, such that the processor 250 is configured to determine a desired (or, alternatively, an optimal) operating frequency of an associated non-volatile memory 100 based on one or more of voltages, temperatures and whether a command being executed on the non-volatile memory 100 is a write operation or a read operation.

For example, the second address ADDR2 may be a logical address used in a host device, and the first address ADDR1 may be a physical address used in a nonvolatile memory 100. The processor 250 loads on the RAM 230 information used to convert the second address ADDR2 into the first address ADDR1 and refers to the information loaded on the RAM 230.

The RAM 230 is used as a working memory, a cache memory, or a buffer memory of the processor 250. The RAM 230 may be a form of a non-transitory computer readable medium. While FIG. 9 illustrates RAM 230 as the non-transitory computer-readable medium, the non-transitory computer readable medium may also be a distributed network, so that the program instructions are stored and executed in a distributed fashion. The non-volatile memory may be a Read Only Memory (ROM), a Programmable Read Only Memory (PROM), an Erasable Programmable Read Only Memory (EPROM), or a flash memory. The volatile memory may be a Random Access Memory (RAM).

The RAM 230 stores codes or instructions that the processor 250 will execute. The RAM 230 stores data processed by the processor 250. The RAM 230 may include an SRAM. The RAM 230 may store the first table TB1 (refer to FIG. 4) or the second table TB2 (refer to FIG. 5), where the first table includes desired (or, alternatively, optimal) frequencies of the nonvolatile memory 100 corresponding to voltages and temperatures, and the second table TB2 includes desired (or, alternatively, optimal) frequencies of the nonvolatile memory 100 corresponding to voltages, temperatures, and a first command CMD1.

The host interface 240 communicates with the external host under a control of the processor 250. The host interface 240 may communicate using at least one of various communication manners: USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The memory interface 210 is configured to communicate with the nonvolatile memory 110 under a control of the processor 250. The memory interface 210 receives the first command CMD1 and the first address ADDR1 from the processor 250 through the bus 121. The memory interface 210 outputs the first command CMD1 and the first address ADDR1 to the nonvolatile memory 100. Also, the memory interface 210 generates a control signal CTRL depending on the first command CMD1 and the first address ADDR1 and outputs the generated control signal CTRL to the nonvolatile memory 100.

The ECC block 220 performs an error correction operation. The ECC block 220 generates parity for error correction based on data to be written at the nonvolatile memory 100. Data and parities may be output to the nonvolatile memory 100 through the memory interface 210. The data and parities thus transferred may be stored at the nonvolatile memory 100. The ECC block 220 corrects an error of data by means of data and parities read from the nonvolatile memory through the memory interface 210.

While example embodiments of the inventive concepts have been described with reference to some example embodiments, it will be apparent to those skilled in the art that various changes and modifications may be made without departing from the spirit and scope of the example embodiments. Therefore, it should be understood that the above example embodiments are not limiting, but illustrative.

What is claimed is:

1. A storage device, comprising:
   a nonvolatile memory configured to perform different operations, the operations including a read operation and a write operation; and
   a memory controller configured to set an operating frequency of the nonvolatile memory based on at least a voltage level of a voltage signal and a temperature of the storage device such that, the memory controller sets the operating frequency of the nonvolatile memory at a higher frequency as the voltage level of the voltage signal approaches a reference voltage level, the voltage signal being transmitted between the memory controller and one of the nonvolatile memory and an external device,
   and configured to increase the operating frequency of the nonvolatile memory as an absolute value of a difference between the temperature of the storage device and a room temperature decreases.

2. The storage device of claim 1, further comprising:
   a voltage detector configured to detect the voltage level of the voltage signal; and
   a temperature sensor configured to sense the temperature of the storage device.

3. The storage device of claim 1, wherein the memory controller comprises:
   a memory interface configured to output a control signal to the nonvolatile memory, the control signal having an operating frequency, the operating frequency being based on the voltage level of the voltage signal and the temperature of the storage device.

4. The storage device of claim 3, wherein
   the control signal is a data strobe signal if the operation is the write operation, and
   the control signal is a read enable signal if the operation is the read operation.

5. The storage device of claim 1, wherein the memory controller is configured to issue a first command to the nonvolatile memory, and to determine the operating frequency of the nonvolatile memory based on whether the first command is a write command to perform the write operation or a read command to perform the read operation.

6. The storage device of claim 5, wherein the memory controller comprises:
   a memory interface configured to output a control signal to the nonvolatile memory, the operating frequency of the control signal being based on the voltage level of the voltage signal, the temperature of the storage device, and the first command.

7. The storage device of claim 6, wherein the memory interface is configured to determine the operating frequency of the nonvolatile memory such that, when the first command is the write command, the operating frequency is higher than that when the first command is the read command.

8. A storage device having a temperature associated therewith, the storage device comprising:
   a nonvolatile memory configured to perform one of a read operation and a write operation in response to a first command; and
   a memory controller configured to output the first command to the nonvolatile memory, and to set an operating frequency of the nonvolatile memory such that, the memory controller sets the operating frequency higher when the temperature is a first temperature while the first command is a write command than when the temperature is the first temperature while the first command is a read command, the memory controller including a memory interface configured to output a control signal to the nonvolatile memory, the operating frequency of the control signal being set based on the first command and on an absolute value of a difference between the temperature and a room temperature.

9. A memory controller configured to control a nonvolatile memory, the nonvolatile memory configured to perform one of a read operation, a write operation, and an erase operation in response to a first command from the memory controller, the memory controller comprising:
   a processor and a memory, the memory containing computer readable code, that when executed, configures the processor to output the first command to the nonvolatile memory, and to set an operating frequency of the nonvolatile memory such that, at a same operating temperature, the operating frequency is higher when the first command is a write command than when the first command is a read command, and the nonvolatile memory is configured to increase the operating frequency as an absolute value of a difference between the temperature of the nonvolatile memory and a room temperature decreases.

10. The memory controller of claim 9, wherein the memory controller is configured to communicate, via signals, with one of the nonvolatile memory and an external host, a voltage level of the signals being relatively lower when the nonvolatile memory operates in a first operating mode than when the nonvolatile memory operates in a second operating mode, and the memory controller is configured to,
   detect an operating mode of the nonvolatile memory based on the voltage level of the signals,
   sense an operating temperature, and
   set the operating frequency of the nonvolatile memory based on at least the detected operating mode and the sensed operating temperature.

11. The memory controller of claim 9, wherein
   a voltage level of signals communicated between at least two of (i) the memory controller, (ii) the nonvolatile memory and (iii) an external device is relatively lower when the nonvolatile memory operates in a first operating mode than when the nonvolatile memory operates in a second operating mode, and the memory controller is configured to,
   detect an operating mode of the nonvolatile memory based on the voltage level of the signals,
   sense an operating temperature, and
   set the operating frequency based on the detected operating mode, the sensed operating temperature, and whether the first command is the write command or the read command.

12. The memory controller of claim 9, wherein the nonvolatile memory is a three-dimensional memory array such that the nonvolatile memory is monolithically formed in one or more physical levels of memory cells having word lines and/or bit lines shared between the physical levels, and the memory cells have active areas disposed above a silicon substrate and include a charge trap layer.

* * * * *